(12) United States Patent
Yao et al.

(10) Patent No.: US 12,085,824 B2
(45) Date of Patent: Sep. 10, 2024

(54) ARRAY SUBSTRATE, LIQUID CRYSTAL DISPLAY PANEL, AND DISPLAY DEVICE

(71) Applicant: Guangzhou China Star Optoelectronics Semiconductor Display Technology Co., LTD., Guangdong (CN)

(72) Inventors: Xinru Yao, Guangdong (CN); Li Xu, Guangdong (CN); Chengcai Dong, Guangdong (CN); Juncheng Xiao, Guangdong (CN)

(73) Assignee: Guangzhou China Star Optoelectronics Semiconductor Display Technology Co., LTD., Guangzhou (CN)

( * ) Notice: Subject to any disclaimer, the term of this patent is extended or adjusted under 35 U.S.C. 154(b) by 0 days.

(21) Appl. No.: 18/090,545

(22) Filed: Dec. 29, 2022

(65) Prior Publication Data
US 2024/0126126 A1 Apr. 18, 2024

(30) Foreign Application Priority Data
Oct. 12, 2022 (CN) .......................... 202211243978.1

(51) Int. Cl.
*G02F 1/1362* (2006.01)
*H01L 27/12* (2006.01)

(52) U.S. Cl.
CPC ...... *G02F 1/136286* (2013.01); *H01L 27/124* (2013.01)

(58) Field of Classification Search
CPC .......................... G02F 1/136286; H01L 27/124
(Continued)

(56) References Cited

U.S. PATENT DOCUMENTS

2008/0084528 A1 4/2008 Lu

FOREIGN PATENT DOCUMENTS

| CN | 105158995 | 12/2015 |
|---|---|---|
| CN | 106094369 | 11/2016 |

(Continued)

OTHER PUBLICATIONS

Notification of Office Action and Search Report Dated Nov. 15, 2022 From the State Intellectual Property Office of the People's Republic of China Re. Application No. 202211243978 and Its Translation Into English. (18 Pages).

*Primary Examiner* — Michael H Caley
*Assistant Examiner* — Illiam D Peterson

(57) ABSTRACT

An array substrate includes a first electrode, scanning lines extending along a first direction, data lines, and common signal lines. The data lines and the common signal lines extend along a second direction. The first electrode includes a first and a second sub-electrode. Each data line is disposed between two common signal lines. Two scanning lines, two common signal lines, and a data line define a first and a second sub-pixel area. The first and the second sub-electrode are disposed within the first and the second sub-pixel area respectively. The first sub-electrode includes a first main portion disposed close to a common signal line and first branch portions spaced along the second direction. A first space is defined between two adjacent first branch portions. Ends of the first branch portions are connected to the first main portion. Another ends of the first branch portions are spaced with a first space.

20 Claims, 6 Drawing Sheets

(58) Field of Classification Search
USPC .......................................................... 349/33
See application file for complete search history.

(56) References Cited

FOREIGN PATENT DOCUMENTS

| | | | | |
|---|---|---|---|---|
| CN | 108257576 | | 7/2018 | |
| CN | 108257576 A | * | 7/2018 | ............... G09G 3/36 |
| CN | 109143696 | | 1/2019 | |
| CN | 110928066 | | 3/2020 | |
| CN | 110928066 A | * | 3/2020 | ....... G02F 1/134309 |
| CN | 113238419 | | 8/2021 | |
| JP | 2009-151204 | | 7/2009 | |

* cited by examiner

ARRAY SUBSTRATE, LIQUID CRYSTAL DISPLAY PANEL, AND DISPLAY DEVICE

FIELD OF INVENTION

The present application relates to the field of display panel technologies and particularly to an array substrate, a liquid crystal display panel, and a display device.

BACKGROUND OF INVENTION

In a display panel with a FFS mode, top electrodes of an array substrate may be a pixel electrode or a common electrode. Each sub-pixel region is provided with a top electrode (pixel electrode or common electrode) and a bottom electrode (pixel electrode or common electrode). The top electrode is generally a mesh-shaped electrode and the bottom electrode is generally a sheet-shaped electrode. Structures of the top electrodes in adjacent sub-pixel regions are completely consistent. An opposite area between a mesh-shaped pixel electrode and a data line is large. This is easy to produce large lateral coupling capacitance, and a risk of signal crosstalk increases.

SUMMARY OF APPLICATION

In view of this, an array substrate with a low lateral coupling capacitance and a low risk of signal crosstalk is provided in the present application.

A liquid crystal display panel including the array substrate is further provided in the present application.

Furthermore, a display device including the liquid crystal display panel is provided in the present application.

For solving above mentioned problems, the technical solutions provided by the present application are as follows:
an array substrate is provided in the present application. The array substrate includes a first electrode, a plurality of scanning lines, a plurality of data lines, and a plurality of common signal lines. The scanning lines extend along a first direction. The data lines and the common signal lines extend along a second direction perpendicular to the first direction. The first electrode includes a first sub-electrode and a second sub-electrode. Each of the data lines is disposed between two adjacent ones of the common signal lines. Two adjacent ones of the scanning lines, two adjacent ones of the common signal lines, and a corresponding data line enclose to define a first sub-pixel area and a second sub-pixel area adjacent to the first sub-pixel area. The first sub-electrode and the second sub-electrode are disposed within the first sub-pixel area and the second sub-pixel area respectively. And the first sub-electrode includes:
a first main portion disposed close to a corresponding common signal line; and
a plurality of first branch portions arranged at intervals along the second direction;
a first space is defined between any two adjacent ones of the first branch portions;
ends of the plurality of first branch portions are connected to the first main portion;
another ends of the plurality of first branch portions are spaced to each other with the first space and are disposed close to a corresponding data line.

In an optional embodiment of the present application, the first branch portions extend from the first main portion along a direction deflecting from the first direction.

In an optional embodiment of the present application, the first sub-electrode further includes:
a second main portion;
a plurality of second branch portions arranged at intervals along the second direction;
a second space is defined between any two adjacent ones of the second branch portions, one of the second branch portions is connected to one of the first branch portions.

In an optional embodiment of the present application, the second main portion is connected to the first main portion, the second main portion and the first main portion are disposed close to a corresponding common signal line; and ends of the plurality of second branch portions are connected to the second main portion, another ends of the plurality of second branch portions are spaced to each other with a second space.

In an optional embodiment of the present application, an extension direction of the first branch portions is different from an extension direction of the second branch portions.

In an optional embodiment of the present application, an included angle $\theta_1$ between the extend direction of the first branch portions and the extension direction of the second branch portions is greater than or equal to 5° and is less than or equal to 45°.

In an optional embodiment of the present application, the second main portion is disposed close to the corresponding data line, ends of the plurality of second branch portions are connected to the second main portion, another ends of the plurality of second branch portions are spaced to each other with a second space.

In an optional embodiment of the present application, the second sub-electrode further includes:
a third main portion disposed close to a corresponding common signal line; and
a plurality of third branch portions arranged at intervals along the second direction.
A third space is defined between any two adjacent ones of the third branch portions, ends of the plurality of third branch portions are connected to the third main portion, another ends of the plurality of third branch portions are spaced to each other with a third space.

In an optional embodiment of the present application, an extension direction of the third branch portions is parallel to and opposite to an extension direction of the first branch portions.

In an optional embodiment of the present application, an extension direction of the third branch portion and an extension direction of the first branch portion intersect in a non-forward direction of the second direction.

In an optional embodiment of the present application, the second sub-electrode further includes:
a fourth main portion; and
a plurality of fourth branch portions arranged at intervals along the second direction;
a fourth space is defined between any two adjacent ones of the fourth branch portions, and one of the fourth branch portions is connected to one of the third branch portions.

In an optional embodiment of the present application, the fourth main portion is connected to the third main portion, in the second sub-pixel area, the fourth main portion and the third main portion are disposed close to a corresponding one of the common signal lines, ends of the plurality of fourth branch portions are connected to the fourth main portion, another ends of the plurality of fourth branch portions are spaced to each other with a fourth space.

In an optional embodiment of the present application, an extension direction of the third branch portions intersects an extension direction of the fourth branch portions.

In an optional embodiment of the present application, an included angle $\theta_2$ between the extend direction of the third branch portions and the extension direction of the fourth branch portions is greater than or equal to 5° and less than or equal to 45°.

In an optional embodiment of the present application, the fourth main portion is disposed close to the corresponding data line; ends of the plurality of fourth branch portions are connected to the fourth main portion, another ends of the plurality of fourth branch portions are spaced to each other with a fourth space.

In an optional embodiment of the present application, the array substrate further including:

a substrate;

a driving circuit layer disposed on the substrate; and a second electrode arranged opposite to the first electrode, wherein the second electrode is disposed on the substrate or on the driving circuit layer, and the second electrode is disposed between the substrate and the first electrode.

Further, the present application provides a liquid crystal display panel. The liquid crystal display panel includes liquid crystals, an opposed substrate, and the abovementioned array substrate. The liquid crystals are disposed between the opposed substrate and the array substrate.

Moreover, the present application provides a display device. The display device includes the abovementioned liquid crystal display panel.

In the array substrate, the liquid crystal display panel, and the display device provided by the present application, a space is defined between any two adjacent branch portions (the first branch portions and/or the second branch portions) of the first sub-electrode of the first electrode. Ends of the plurality of first branch portions are connected to the first main portion, and another ends of the plurality of first branch portions are spaced to each other with a first space. This can increase an area of a hollowed-out portion of a side of the first electrode facing a data line to reduce a face-to-face area between the first electrode and the data lines. The face-to-face area between the first electrode and the data line is reduced to reduce the lateral coupling capacitance and the risk of low signal crosstalk.

DESCRIPTION OF DRAWINGS

In order to explain embodiments or technical solutions in the prior art more clearly, the following will briefly introduce drawings involved in a following description of the embodiments or the prior art. Obviously, the drawings in the following description are merely inventions. Those of ordinary skill in the art can obtain other drawings based on these drawings without creative work.

DETAILED DESCRIPTION OF EMBODIMENTS

Figure 1:
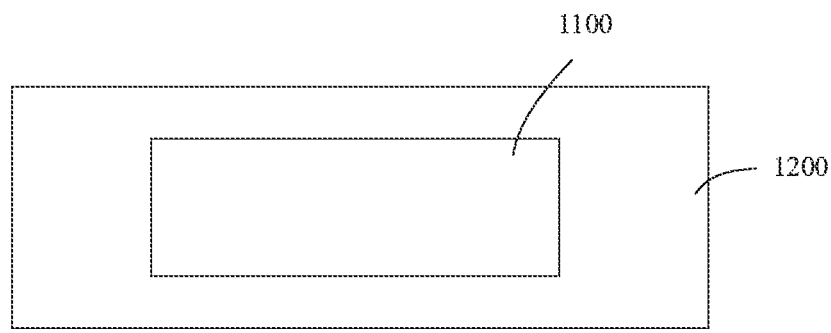
FIG. 1 is a schematic module view of a display device provided by an embodiment of the present application.

The technical solutions in the embodiments of the present application will be clearly and completely described in conjunction with the drawings in the embodiments of the present application. Obviously, the described embodiments are only a part of the embodiments of the present application, rather than all the embodiments. Based on the embodiments in the present application, all other embodiments obtained by those skilled in the art without creative work shall fall within a protection scope of the present application.

In the description of the present application, it should be understood that, an orientation or positional relationship indicated by terms "upper", "lower", etc. are based on an orientation or positional relationship shown in the drawings, and is only for convenience of describing the application and simplifying the description. It does not indicate or imply that a pointed device or an element must have a specific orientation, or be configured and operated in a specific orientation, and therefore it cannot be understood as a limitation of the present application. In addition, terms "first" and "second" are only used for descriptive purposes and cannot be understood as indicating or implying relative importance or implicitly indicating a number of indicated technical features. Therefore, the features defined with "first" and "second" may explicitly or implicitly include one or more of the features. In the description of the present application, "a plurality of" means two or more, unless otherwise specifically defined.

The present application may repeat reference numerals and/or reference letters in different embodiments. This repetition is for a purpose of simplification and clarity and does not indicate a relationship between various embodiments and/or settings discussed.

An array substrate, a liquid crystal display panel, and a display device provided by the present application will be described in detail below with reference to embodiments and drawings.

Please refer to FIG. 1. A display device 1000 is provided. The display device 1000 includes a liquid crystal display panel 1100/1300 and a main portion 1200. The liquid crystal display panel 1100/1300 is disposed on/in the main portion 1200.

The display device 1000 may be a virtual reality (VR) display device, a display screen, a calculator, a mobile phone, a computer, a notebook, a watch, and other electronic devices capable of displaying.

The liquid crystal display panel 1100/1300 includes an array substrate, an opposed substrate, and liquid crystals. The liquid crystals are disposed between the opposed substrate and the array substrate.

A display mode of the liquid crystal display panel 1100/1300 may be a FFS mode.

In detail, the array substrate includes a substrate, a driving circuit layer disposed on the substrate, a first electrode, and a second electrode. The first electrode is disposed opposite to the second electrode. The first electrode and the second electrode are separated by an insulating layer. The first electrode is disposed on the second electrode, that is, the first electrode is a top electrode, and the second electrode is a bottom electrode.

The first electrode may be a pixel electrode or a common electrode, and correspondingly the second electrode is a common electrode or a pixel electrode. In a case that the first electrode is a pixel electrode, the first electrode is electrically connected to the driving circuit layer. In another case that the first electrode is a common electrode, the second electrode is electrically connected to the driving circuit layer.

In detail, referring to FIG. 2 to FIG. 5, a structure of the liquid crystal display panel will be briefly described below by taking structures of a liquid crystal display panel 1100 shown in FIG. 2 and FIG. 3 and structures of the liquid crystal display panel 1300 shown in FIG. 4 and FIG. 5 as examples.

Figure 2:
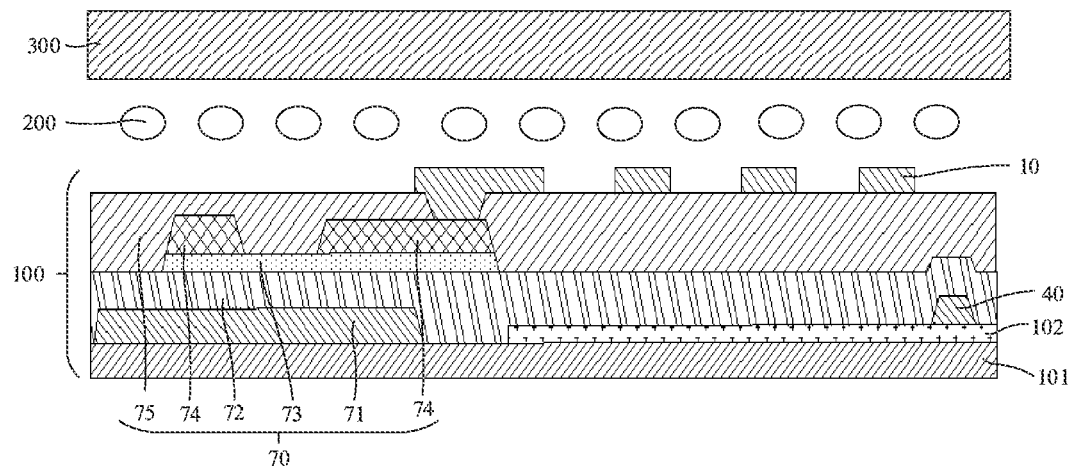
FIG. 2 is a schematic cross-sectional view of a side of a thin film transistor of a liquid crystal display panel shown in FIG. 1.
Figure 3:
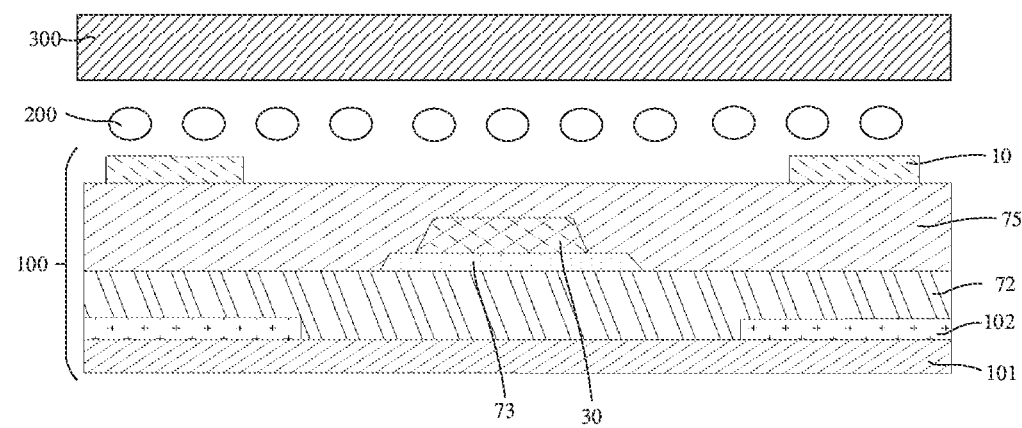
FIG. 3 is a schematic cross-sectional view of a side of a data line of the liquid crystal display panel shown in FIG. 2.

Referring to FIG. 2 to FIG. 3, the liquid crystal display panel 1100 includes an array substrate 100, liquid crystals 200, and an opposed substrate 300. The liquid crystals 200 are disposed between the opposed substrate 300 and the array substrate 100. The array substrate 100 includes a substrate 101, a driving circuit layer 70 formed on the substrate 101, a first electrode 10 formed on the driving circuit layer 70, and a second electrode 102 formed on the substrate 101. The second electrode 102 is disposed opposite to the first electrode 10. The first electrode 10 is disposed above the second electrode 102. The first electrode 10 is insulated from the second electrode 102. In the embodiment, the first electrode 10 is a pixel electrode and is a mesh electrode, and the second electrode 102 is a common electrode and is a pellet electrode.

The driving circuit layer 70 includes a plurality of driving transistors. Each of the driving transistors includes a gate 71 formed on the substrate 101, a gate insulation layer 72 formed on the substrate 101 and covering the gate 71, an active layer 73 formed on the gate insulation layer 72 and disposed opposite to the gate 71, a source and drain layer 74 formed on the gate insulation layer 72 and electrically connected to the active layer 73, a passivation layer 75 formed on the gate insulation layer 72 and covering the source and drain layer 74, and a flat layer (not shown) formed on the passivation layer 75. The second electrode 102 is formed on the substrate 101 and is covered by the gate insulation layer 72. The first electrode 10 is formed on the passivation layer 75 (or the flat layer). The first electrode 10 is electrically connected to the source and drain layer 74.

Referring to FIG. 2 to FIG. 3, the array substrate 100 further includes a plurality of scanning lines (not shown in FIG. 2 and FIG. 3), a plurality of data lines 30 (shown in FIG. 3), and a plurality of common signal lines 40 (shown in FIG. 2). The scanning lines and the common signal lines 40 are respectively arranged on a same layer with the gate 71. The data lines 30 are arranged on a same layer with the source and drain layer 74. The scanning lines are electrically connected to the gate 71. The common signal lines 40 are electrically connected to the second electrode 102 (common electrode). The data lines 30 are electrically connected to the source and drain layer 74. The scanning lines are configured to provide a scanning signal for the driving transistor. The data lines 30 are configured to provide a data signal for the driving transistor. The common signal lines 40 are configured to provide a common signal for the driving transistor. The first electrode 10 is disposed opposite to the second electrode 102 to form an electric field that drives the liquid crystals 200 to deflect.

Of course, in another embodiments, a structure of the array substrate 100 is not limited to the structure described above.

Figure 4:
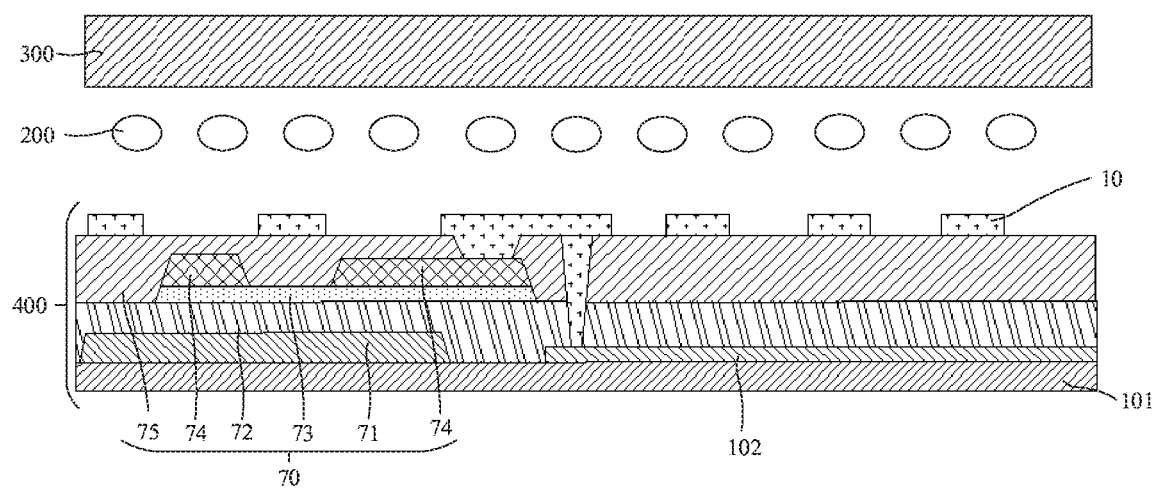
FIG. 4 is a schematic cross-sectional view of a side of a thin film transistor of another liquid crystal display panel shown in FIG. 1.
Figure 5:
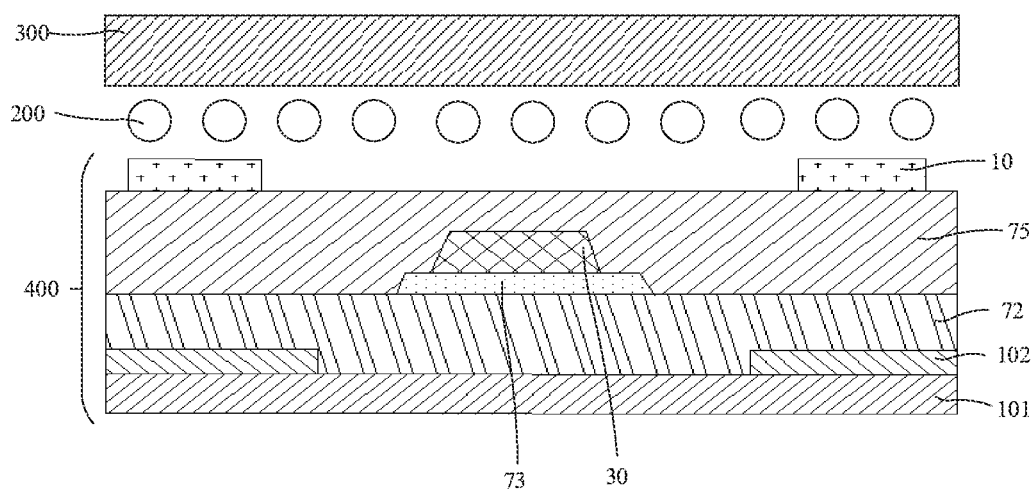
FIG. 5 is a cross-sectional view of a side of a data line side of the liquid crystal display panel shown in FIG. 4.
Figure 6:
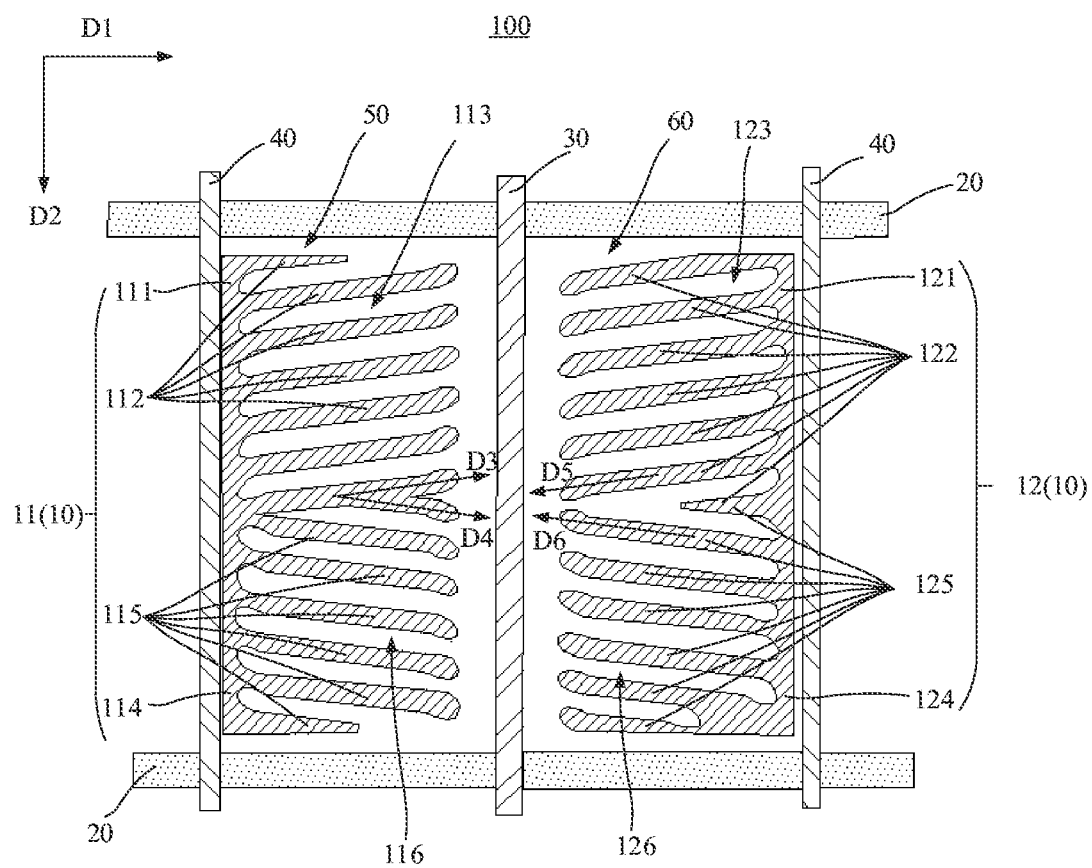
FIG. 6 is a schematic partial top view of an array substrate provided by a first embodiment of the present application.
Figure 7:
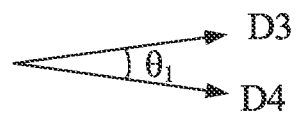
FIG. 7 is a schematic view showing extending directions of first branch portions and second branch portions of a first sub-electrode in the array substrate shown in FIG. 6.
Figure 8:
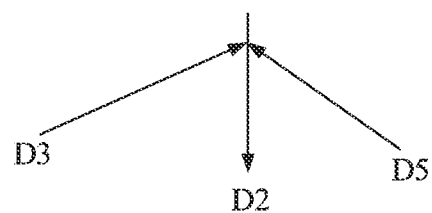
FIG. 8 is a schematic view showing extending directions of first branch portions of a first sub-electrode and third branch portions of a second sub-electrode provided by another embodiment of the present application.
Figure 9:
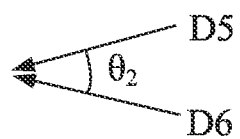
FIG. 9 is a schematic view showing extending directions of third branch portions and fourth branch portions of a second sub-electrode in the array substrate shown in FIG. 6.

Referring to FIG. 4 and FIG. 5, a structure of the liquid crystal display panel 1300 is similar to that of the liquid crystal display panel 1100. Differences are that the first electrode 10 of the liquid crystal display panel 1300 is a common electrode, and the second electrode 102 is a pixel electrode. The first electrode 10 is electrically connected to the second electrode 102 and the source and drain layer 74 respectively, so that the second electrode 102 is electrically connected to the source drain layer 74.

A structure of the above mentioned first electrode will be described in FIGS. 6 to 10.

Referring to Referring to FIGS. 6 to 9, a first electrode 10 is provided in an optional embodiment of the present application. It is defined that the scanning lines 20 extend in a first direction D1, and the common signal lines 40 and the data lines 30 extend in a second direction D2 perpendicular to the first direction D1. Each of the data lines 30 is disposed between two adjacent ones of the common signal lines 40. Two adjacent ones of the scanning lines 20, two adjacent ones of the common signal lines 40, and a corresponding data line 30 enclose to define a first sub-pixel area 50 and a second sub-pixel area 60 adjacent to the first sub-pixel area 50. The first electrode 10 includes a first sub-electrode 11 and a second sub-electrode 12. The first sub-electrode 11 and the second sub-electrode 12 are disposed within the first sub-pixel area 50 and the second sub-pixel area 60 respectively.

In the array substrate 100 provided by the present application, the first sub-electrode and the second sub-electrode of the first electrode are respectively arranged in the first sub-pixel area 50 and the second sub-pixel area 60 enclosed by the adjacent ones of the scanning lines 20, the two adjacent ones of the common signal lines 40, and the corresponding data line 30. Comparing with a sub-pixel area enclosed by two adjacent scanning lines and two adjacent data lines in the prior art, the array substrate 100 provided by the present application can reduce a number of the data lines by half, and thereby reduce manufacturing difficulty of the array substrate and reduce the cost.

In an optional embodiment of the present application, the first sub-electrode 11 includes a first main portion 111 and a plurality of first branch portions 112 arranged at intervals along the second direction D2. In the first sub-pixel area 50, the first main portion 111 is disposed close to a corresponding common signal line 40. Ends of the plurality of first branch portions 112 are connected to the first main portion 111, and another ends of the plurality of first branch portions 112 are spaced to each other with a first space 113. That is, one end of the first space 113 facing the first main portion 111 is closed, and another end of the first space 113 away from the first main portion 111 and close to the corresponding data line 30 is an opening.

In a top direction of the array substrate 100, the first branch portions 112 extend from the first main portion 111 along a direction deflecting from the first direction D1 (a direction toward the data line 30).

In an optional embodiment of the present application, in a top view of the array substrate 100, a shortest distance from one end of the first branch portion 112 away from the first main portion 111 to a scanning line 20 is less than a shortest distance from the end of the first branch portion 112 connected to the first main portion 111 to the same scanning line 20.

In an optional embodiment of the present application, the first sub-electrode 11 further includes a second main portion 114 and a plurality of second branch portions 115 spaced along the second direction D2. Ends of the plurality of second branch portions 115 are connected to the second main portion 114. A second space 116 is defined between any two adjacent ones of the second branch portions 115. one of the second branch portions 115 is connected to one of the first branch portions 112.

Referring again to FIG. 6, in the embodiment, the second main portion 114 is connected to the first main portion 111. Further, the second main portion 114 is integrally formed with the first main portion 111. Ends of the plurality of second branch portions 115 are connected to the second main portion 114, and another ends of the plurality of second branch portions 115 are spaced to each other with a second space 116. That is, one end of the second space 116 facing the second main portion 114 is closed, and another end of the second space 116 away from the second main portion 114 and close to the corresponding data line 30 is an opening.

Referring again to FIGS. 6 and 7, the first branch portions 112 and the second branch portions 115 respectively extend from the first main portion 111 and the second main portion 114 to the corresponding data line 30. An extension direction D3 of the first branch portions 112 from the first main portion 111 is different from an extension direction D4 of the second branch portions 115 from the second main portion 114. That is, with the first branch portions 112 and the second branch portions 115 extending, a distance between the first branch portions 112 and the second branch portions 115 gradually increases.

An included angle $\theta_1$ between the extend direction D3 of the first branch portions 112 and the extension direction D4 of the second branch portions 115 is greater than 0°. Further, the included angle $\theta_1$ between the extend direction D3 of the first branch portions 112 and the extension direction D4 of the second branch portions 115 is greater than or equal to 5° and is less than or equal to 45°.

Referring again to FIG. 6, in the embodiment, the first sub-electrode 11 and the second sub-electrode 12 are disposed on either side of the corresponding data line 30. The second sub-electrode 12 includes a third main portion 121 and a plurality of third branch portions 122 arranged at intervals along the second direction D2. In the second sub-pixel area 60, the third main portion 121 is disposed close to a corresponding common signal line 40. A third space 123 is defined between any two adjacent ones of the third branch portions 122. Ends of the plurality of third branch portions 122 are fixed to the third main portion 121, and another ends of the plurality of third branch portions 122 are spaced to each other with a third space 123. That is, one end of the third space 123 facing the third main portion 121 is closed, and another end of the third space 123 away from the third main portion 121 and close to the corresponding one of the data lines 30 is an opening.

Referring again to FIG. 6, in an optional embodiment of the present application, an extension direction of the third branch portions 122 is parallel to and opposite to an extension direction of the first branch portions 112.

Referring again to FIG. 8, in an optional embodiment of the present application, an extension direction of the third branch portion 122 and an extension direction of the first branch portion 112 intersect and are in a non-forward direction of the second direction D2.

Referring again to FIGS. 6 and 9, in an optional embodiment of the present application, the second sub-electrode 12 further includes a fourth main portion 124 and a plurality of fourth branch portions 125 arranged at intervals along the second direction D2. Ends of the plurality of fourth branch portions 125 is connected to the fourth main portion 124, and another ends of the plurality of fourth branch portions 125 are spaced to each other with a fourth space 126. one of the fourth branch portions 125 is connected to one of the third branch portions 122. The fourth main portion 124 is connected to the third main portion 121. In the second sub-pixel area 60, the fourth main portion 124 and the third main portion 121 are disposed closed to the corresponding common signal line 40. Ends of the plurality of fourth branch portions 125 is connected to the fourth main portion 124, and another ends of the plurality of fourth branch portions 125 are spaced to each other with the fourth space 126. That is, one end of the fourth space 126 facing the fourth main portion 124 is closed, and another end of the fourth space 126 away from the fourth main portion 124 and close to the corresponding one of the data lines 30 is an opening.

The third branch portions 122 and the fourth branch portions 125 respectively extend from the third main portion 121 and the fourth main portion 12 to the corresponding data line 30. An extension direction D5 of the third branch portions 122 intersects an extension direction D6 of the fourth branch portions 125. That is, with the third branch portions 122 and the fourth branch portions 125 extending, a distance between the third branch portions 122 and the fourth branch portions 125 gradually decreases.

Referring again to FIGS. 6 and 9, An included angle $\theta_2$ between the extension direction D5 of the third branch portions 122 and the extension direction D6 of the fourth branch portions 125 is greater than 0°. Further, the included angle $\theta_2$ between the extension direction D5 of the third branch portions 122 and the extension direction D6 of the fourth branch portions 125 is greater than or equal to 5° and is less than or equal to 45°.

Figure 10:
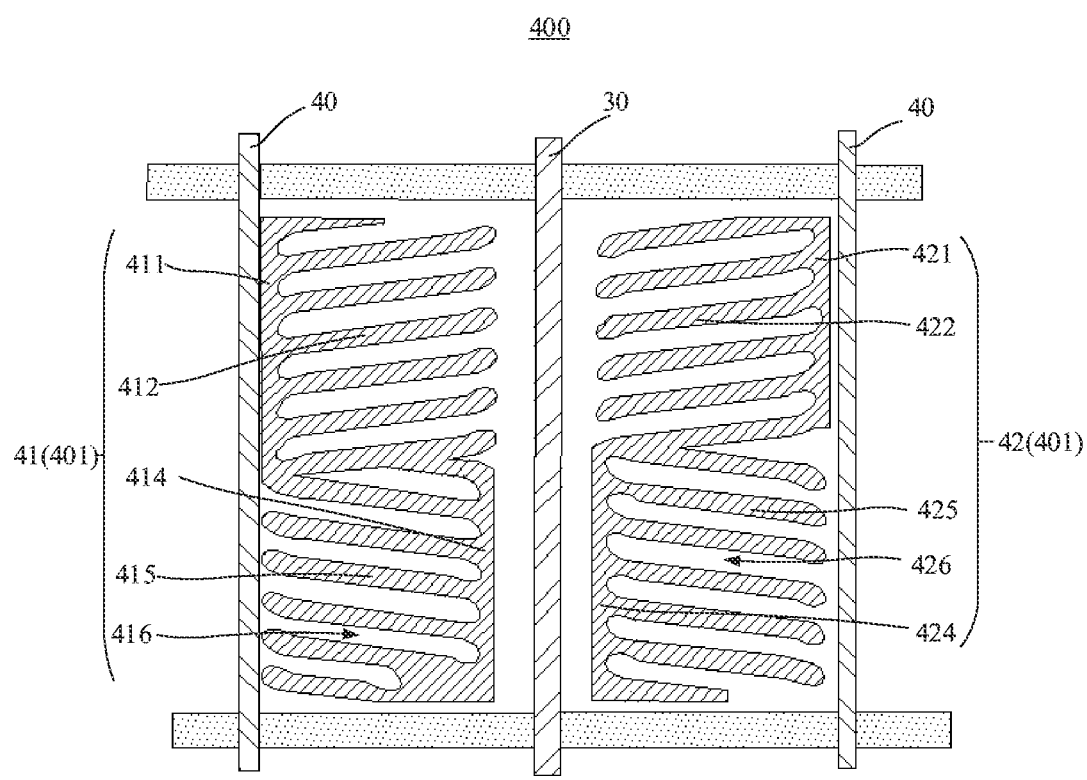
FIG. 10 is a schematic partial top view of an array substrate provided by a second embodiment of the present application.

Referring to FIG. 10, an array substrate 400 is provided by a second embodiment of the present application. A structure of the array substrate 400 is similar to that of the array substrate 100, except for a structure of the first electrode. In detail, a second main portion 414 of a first sub-electrode 41 of a first electrode 401 is disposed close to a corresponding data line 30. That is, a first main portion 411 of the first sub-electrode 41 of the first electrode 401 is not connected to the second main portion 414. Ends of a plurality of second branch portions 415 is connected to the second main portion 414, and another ends of the plurality of second branch portions 415 are separated to each other with a second space 416. That is, one end of the second space 416 facing the second main portion 414 is closed, and another end of the second space 416 away from the second main portion 414 and the corresponding data line 30 is an opening. A fourth main portion 424 of a second sub-electrode 42 of the first electrode 401 is disposed close to the corresponding data line 30. That is, a third main portion 421 of the second sub-electrode 42 of the first electrode 401 is not connected to the fourth main portion 424. Ends of a plurality of fourth branch portions 425 are connected to the fourth main portion 424, and another ends of the plurality of fourth branch portions 425 are separated to each other with a fourth space 426. That is, one end of the fourth space 426 facing the fourth main portion 424 is closed, and another end of the fourth space 426 far away from the fourth main portion 424 and the corresponding data line 30 is an opening. The first branch portions 412 have the same structures as the first branch portions 112 of the array substrate 100, and the third branch portions 422 have the same structures as the third branch portions 122 of the array substrate 100.

In the array substrate, the liquid crystal display panel, and the display device provided by the present application, a space is defined between any two adjacent branch portions (the first branch portions and/or the second branch portions) of the first sub-electrode of the first electrode. Ends of the plurality of first branch portions are connected to the first main portion, and another ends of the plurality of first branch portions are spaced to each other with a first space. Firstly, this can increase an area of a hollowed-out portion of a side of the first electrode facing a data line to reduce a face-to-face area between the first electrode and the data lines. The face-to-face area between the first electrode and the data line is reduced to reduce the lateral coupling capacitance and the risk of low signal crosstalk. Secondly, the area of the hollowed-out portion of the first electrode is increased, thereby increasing transmittance of the first electrode. Thirdly, the area of the hollowed-out portion of the first electrode is increased, thereby reducing an opposite area between the first electrode (top electrode) and the second electrode (bottom electrode) to reduce a storage capacitor defined between the first electrode (top electrode) and the second electrode (bottom electrode). Fourthly, one of the data lines is disposed between two adjacent common signal lines. Two adjacent scanning lines, two common signal lines, and the corresponding data line enclose a first sub-pixel area and a second sub-pixel area adjacent to the first sub-pixel area. So that the number of data lines can be halved.

The description of the above embodiments is only used to help understand the technical solutions and core ideas of the application. Those of ordinary skill in the art should understand that: they can still modify the technical solutions recorded in the foregoing embodiments, or equivalently replace some of the technical features, and these modifications or replacements do not cause the essence of the corresponding technical solutions to deviate from the scope of the technical solutions of the embodiments of the present application.

What is claimed is:

1. An array substrate, comprising a first electrode, a plurality of scanning lines, a plurality of data lines, and a plurality of common signal lines, wherein the scanning lines extend along a first direction, the data lines and the common signal lines extend along a second direction intersecting the first direction, the first electrode comprises a first sub-electrode and a second sub-electrode, each of the data lines is disposed between two adjacent ones of the common signal lines, two adjacent ones of the scanning lines, two adjacent ones of the common signal lines, and a corresponding one of the data lines enclose to define a first sub-pixel area and a second sub-pixel area adjacent to the first sub-pixel area, the first sub-electrode and the second sub-electrode are disposed within the first sub-pixel area and the second sub-pixel area respectively; wherein the first sub-electrode comprises:
a first main portion disposed adjacent to one of the two adjacent ones of the common signal lines;
a plurality of first branch portions arranged at intervals along the second direction; and
a first space defined between two adjacent ones of the first branch portions, ends of the first branch portions are connected to the first main portion, another ends of the two adjacent ones of the first branch portions are spaced to each other with the first space, and are disposed adjacent to a corresponding data line; and
wherein the second sub-electrode comprises:
a third main portion disposed adjacent to another of the two adjacent ones of the common signal lines;
a plurality of third branch portions arranged at intervals along the second direction; and
a third space defined between two adjacent ones of the third branch portions, ends of the third branch portions are connected to the third main portion, and another ends of the two adjacent ones of the third branch portions are spaced to each other with the third space and are disposed adjacent to the corresponding data line.

2. The array substrate of claim 1, wherein the first sub-electrode differs from the second sub-electrode, the first branch portions extend from the first main portion along a direction deflecting from the first direction.

3. The array substrate of claim 1, wherein the first sub-electrode further comprises:
a second main portion; and
a plurality of second branch portions arranged at intervals along the second direction; and
wherein a second space is defined between two adjacent ones of the second branch portions, and one of the second branch portions is directly connected to one of the first branch portions.

4. The array substrate of claim 3, wherein the second main portion is connected to the first main portion, the second main portion and the first main portion are disposed adjacent to the one of the two adjacent ones of the common signal lines, ends of the second branch portions are connected to the second main portion, and another ends of the two adjacent ones of the second branch portions are spaced to each other with the second space.

5. The array substrate of claim 4, wherein an extension direction of the first branch portions is different from an extension direction of the second branch portions.

6. The array substrate of claim 5, wherein an included angle $\theta_1$ between the extend direction of the first branch portions and the extension direction of the second branch portions is greater than or equal to 5° and is less than or equal to 45°.

7. The array substrate of claim 3, wherein the second main portion is disposed adjacent to the corresponding data line, ends of the second branch portions are connected to the second main portion, and another ends of the two adjacent ones of the second branch portions are spaced to each other with the second space and are disposed adjacent to the one of the two adjacent ones of the common signal lines.

8. The array substrate of claim 1, wherein a shortest distance from one end of the first branch portion away from the first main portion to one of the two adjacent ones of the scanning lines that is adjacent to that the first branch portion is less than a shortest distance from the end of the first branch portion connected to the first main portion to the same scanning line.

9. The array substrate of claim 1, wherein an extension direction of the third branch portions is parallel to and opposite to an extension direction of the first branch portions.

10. The array substrate of claim 1, wherein an extension direction of the third branch portion and an extension direction of the first branch portion intersect and are in a non-forward direction of the second direction.

11. The array substrate of claim 1, wherein the second sub-electrode further comprises:
a fourth main portion; and
a plurality of fourth branch portions arranged at intervals along the second direction; wherein a fourth space is defined between two adjacent ones of the fourth branch portions, and one of the fourth branch portions is directly connected to one of the third branch portions.

12. The array substrate of claim 11, wherein the fourth main portion is connected to the third main portion; in the second sub-pixel area, the fourth main portion and the third main portion are disposed adjacent to another of the two adjacent ones of the common signal lines, ends of the fourth branch portions are connected to the fourth main portion, and another ends of the two adjacent ones of the fourth branch portions are spaced to each other with the fourth space and are disposed adjacent to the corresponding data line.

13. The array substrate of claim 12, wherein an extension direction of the third branch portions intersects an extension direction of the fourth branch portions.

14. The array substrate of claim 13, wherein an included angle $\theta_2$ between the extend direction of the third branch portions and the extension direction of the fourth branch portions is greater than or equal to 5° and is less than or equal to 45°.

15. The array substrate of claim 11, wherein the fourth main portion is disposed adjacent to the corresponding data line, ends of the fourth branch portions are connected to the fourth main portion, and another ends of the two adjacent ones of the fourth branch portions are spaced to each other with the fourth space and are disposed adjacent to another of the two adjacent ones of the common signal lines.

16. The array substrate of claim 1, further comprising:
a substrate;
a driving circuit layer disposed on the substrate; and
a second electrode arranged opposite to the first electrode, wherein the second electrode is disposed on the substrate or on the driving circuit layer, and the second electrode is disposed between the substrate and the first electrode.

17. A liquid crystal display panel, comprising liquid crystals, an opposed substrate, and an array substrate, wherein the liquid crystals are disposed between the opposed substrate and the array substrate;
wherein the array substrate comprises a first electrode, a plurality of scanning lines, a plurality of data lines, and a plurality of common signal lines, the scanning lines extend along a first direction, the data lines and the common signal lines extend along a second direction perpendicular to the first direction, the first electrode comprises a first sub-electrode and a second sub-electrode, each of the data lines is disposed between two adjacent ones of the common signal lines, two adjacent ones of the scanning lines, two adjacent ones of the common signal lines, and a corresponding one of the data lines enclose to define a first sub-pixel area and a second sub-pixel area adjacent to the first sub-pixel area, the first sub-electrode and the second sub-electrode are respectively disposed in the first sub-pixel area and the second sub-pixel area; wherein the first sub-electrode comprises:
a first main portion disposed adjacent to one of the two adjacent ones of the common signal lines;
a plurality of first branch portions arranged at intervals along the second direction; and
a first space defined between two adjacent ones of the first branch portions, ends of the first branch portions are connected to the first main portion, and another ends of the two adjacent ones of the first branch portions are spaced to each other with the first space, and are disposed adjacent to a corresponding data line; and
wherein the second sub-electrode comprises:
a third main portion disposed adjacent to another of the two adjacent ones of the common signal lines;
a plurality of third branch portions arranged at intervals along the second direction; and
a third space defined between two adjacent ones of the third branch portions, ends of the third branch portions are connected to the third main portion, and another ends of the two adjacent ones of the third branch portions are spaced to each other with the third space and are disposed adjacent to the corresponding data line.

18. The liquid crystal display panel of claim 17, wherein the first sub-electrode further comprises:
a second main portion, and
a plurality of second branch portions arranged at intervals along the second direction;
wherein a second space is defined between two adjacent ones of the second branch portions, one of the second branch portions is connected to one of the first branch portions; the second main portion is connected to the first main portion, the second main portion and the first main portion are disposed adjacent to a corresponding common signal line; and ends of the second branch portions are connected to the second main portion, and another ends of the two adjacent ones of the second branch portions are spaced to each other with the second space.

19. The liquid crystal display panel of claim 17, wherein a shortest distance from one end of the first branch portion away from the first main portion to one of the two adjacent ones of the scanning lines that is adjacent to that the first branch portion is less than a shortest distance from the end of the first branch portion connected to the first main portion to the same scanning line;
and
wherein the first sub-electrode differs from the second sub-electrode.

20. A display device, comprising a liquid crystal display panel, wherein the liquid crystal display panel comprises liquid crystals, an opposed substrate, and an array substrate, and the liquid crystals are disposed between the opposed substrate and the array substrate;
wherein the array substrate comprises a first electrode, a plurality of scanning lines, a plurality of data lines, and a plurality of common signal lines, the scanning lines extend along a first direction, the data lines and the common signal lines extend along a second direction perpendicular to the first direction, and the first electrode comprises a first sub-electrode and a second sub-electrode;
wherein each of the data lines is disposed between two adjacent ones of the common signal lines, two adjacent ones of scanning lines, two adjacent ones of the common signal lines, and a corresponding data line enclose to define a first sub-pixel area and a second sub-pixel area adjacent to the first sub-pixel area, the first sub-electrode and the second sub-electrode are respectively disposed in the first sub-pixel area and the second sub-pixel area; wherein the first sub-electrode comprises:

a first main portion disposed adjacent to one of the two adjacent ones of the common signal lines;

a plurality of first branch portions arranged at intervals along the second direction; and a first space defined between two adjacent ones of the first branch portions, ends of the first branch portions are connected to the first main portion, and another ends of the two adjacent ones of the first branch portions are spaced to each other with the first space, and are disposed adjacent to a corresponding data line; and wherein the second sub-electrode comprises:

a third main portion disposed adjacent to another of the two adjacent ones of the common signal lines;

a plurality of third branch portions arranged at intervals along the second direction; and a third space defined between two adjacent ones of the third branch portions, ends of the third branch portions are connected to the third main portion, and another ends of the two adjacent ones of the third branch portions are spaced to each other with the third space and are disposed adjacent to the corresponding data line.

\* \* \* \* \*